United States Patent [19]
Dendall

[11] 3,943,003

[45] Mar. 9, 1976

[54] PADDED SOLAR CELL CONTACTS

[75] Inventor: Robert John Dendall, Gaithersburg, Md.

[73] Assignee: Communications Satellite Corporation, Washington, D.C.

[22] Filed: Dec. 4, 1973

[21] Appl. No.: 421,563

[52] U.S. Cl. .................................. 136/89; 29/572
[51] Int. Cl.² .................. H01L 31/04; H01L 21/34
[58] Field of Search .......................... 136/89; 29/572

[56] References Cited
UNITED STATES PATENTS

| | | | |
|---|---|---|---|
| 2,517,602 | 8/1950 | Richards et al. | 136/89 X |
| 3,434,885 | 3/1969 | Mandelkorn et al. | 136/89 |
| 3,533,850 | 10/1970 | Tarneja et al. | 136/89 |
| 3,565,686 | 2/1971 | Babcock et al. | 136/89 X |

OTHER PUBLICATIONS

A New Type of Solar Cell Array, E. Nitsche et al., pp. 293 and 298–299, S0231–0045, Conf. Record 8th IEEE Conf. Seattle, Wash. 8/1970.

Silicon Solar Cell Tech. of 70, Gereth et al., pp. 353–357, Conf. 8th IEEE Photovoltaic Spec. Conf. 8/1970, S0231–0051.

Electrochemically Parsinated Contacts for Silicon Cells, Fischer et al., pp. 459–464.

*Primary Examiner*—Allen B. Curtis
*Attorney, Agent, or Firm*—Sughrue, Rothwell, Mion, Zinn & Macpeak

[57] ABSTRACT

In a solar cell a pad of material is placed between the cell semiconductor surface and the portion of the top electrode which is bonded to an interconnector. The pad prevents destruction of the cell p-n junction during bonding. The pad may be the same as an anti-reflective coating and may be formed simultaneously with the formation of the anti-reflective coating.

19 Claims, 15 Drawing Figures

PADDED SOLAR CELL CONTACTS

BACKGROUND OF THE INVENTION

The invention is in the field of solar cells and is particularly directed to protecting the solar cell p-n junction when interconnections are made between solar cells to form an array of solar cells.

A solar cell is another name for a photovoltaic cell, the latter being a device which responds to light causing a potential difference between two terminals of said device. The most common solar cell in use today is a silicon cell, but other semiconductor materials are also known to be suitable for solar cells.

The basic parts of a cell are a semiconductor material having a p-n junction therein below the upper surface of the cell, a back electrode, and a front electrode. The front electrode is always constructed to allow light to pass into the cell through the upper surface thereof. Typically, the front or top electrode comprises a number of thin metallic fingers connected to a larger metallic land portion. The land portion, as defined herein, is the portion of the top electrode to which an external interconnector is attached. External interconnection is necessary to form complete solar cell arrays.

Most solar cells also have anti-reflective coatings which cover at least so much of the top surface which is not covered by the top electrode. The anti-reflective coating serves the purpose of preventing useful radiation from being reflected off the surface of the cell. The U.S. Pat. No. 3,533,850 to Tarneja et al teaches a number of anti-reflective coatings and associated methods of fabricating cells with anti-reflective coating. The following U.S. patent applications, assigned to the assignee herein, teach particular anti-reflective coatings and methods of fabricating solar cells with the anti-reflective coatings thereon:

I. "Tantalum Pentoxide Anti-Reflective Coating," by Lindmayer et al, Ser. No. 249,024, filed May 1, 1972.
II. "Niobium Pentoxide Anti-Reflective Coating," by Lindmayer et al, Ser. No. 331,741, filed Feb. 13, 1973.
III. "Method of Applying Anti-Reflective Coating to a Solar Cell," by Lindmayer et al, Ser. No. 331,739, filed Feb. 13, 1973.

Most present solar cells also include a quartz cover slide placed over the anti-reflective coating and top electrode. The quartz cover slide protects the cell from harmful radiation.

In the past most solar cell arrays used in extra-terrestrial operation, such as on earth satellites, were body mounted on the space vehicle. Although the body mounted arrays passed into and out of the sun's rays, the body of the space vehicle prevented the thermal cycling of the arrays from being so great as to cause failure or fatigue of the solder which was typically used to connect the interconnectors to the lands. More recently, solar arrays have been sun oriented. That is, rather than being directly mounted on the vehicle body they have been mounted on wings or flaps which extend away from the vehicle body and which orient the solar arrays toward the sun. While sun oriented arrays have obvious benefits, one of the disadvantages of such arrays is that solder is no longer suitable to connect the interconnectors to the lands. The thermal cycling of sun oriented arrays is so great that the solder cracks.

As a result of the above problem, solder has been eliminated, and bonding methods such as welding and thermal compression bonding are used to secure the interconnectors to the lands. The problem with these methods of bonding is that they introduce mechanical pressure and large amounts of heat to the cell at the land. This tends to destroy the p-n junction locally below the land, resulting in an I-V curve for the cells which is not as sharp as it otherwise would be. Ultrasonic bonding may also be used but it creates the same problem as welding and thermal compression bonding.

The problem is even more acute for a particular preferred high-efficiency solar cell of the type described in U.S. patent application, "Fine Geometry Solar Cell," by Lindmayer, Ser. No. 184,393, filed Sept. 28, 1971 and assigned to the assignee herein. In the fine geometry solar cell the improved electrode pattern allows the p-n junction to be placed much closer to the surface than in prior art cells, with the result that overall efficiency is increased. However, these cells, due to the closeness of the p-n junction to the surface, are even more susceptible to local destruction of the p-n junction below the land during bonding.

SUMMARY OF THE INVENTION

In accordance with the present invention the problems of the prior art are ameliorated by the addition of a pad below the land portion of the top electrode. The pad has poor thermal conductivity, is hard, and adheres to the electrode metal and the semiconductor surface. During bonding the pad prevents destructive amounts of mechanical pressure and heat from being transferred to the underlying p-n junction.

In a particular embodiment of the present invention, the pad comprises the same material as the anti-reflective coating.

In another particular embodiment of the invention the pad and the anti-reflective coating are formed on the cell during the same process step.

DETAILED DESCRIPTION OF THE DRAWINGS

Figure 1:
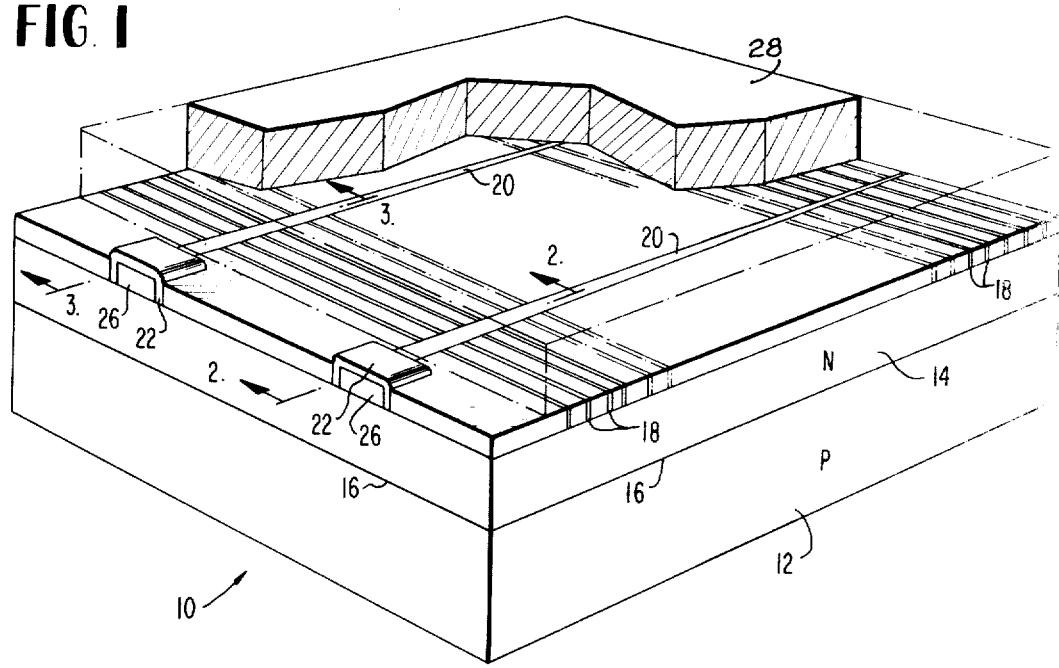
FIG. 1 is a perspective view of a preferred embodiment of the present invention.
Figure 2:
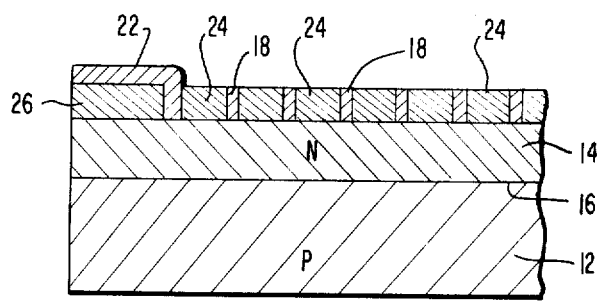
FIG. 2 is a cross-sectional view of FIG. 1 taken along line 2—2 of FIG. 1.
Figure 3:
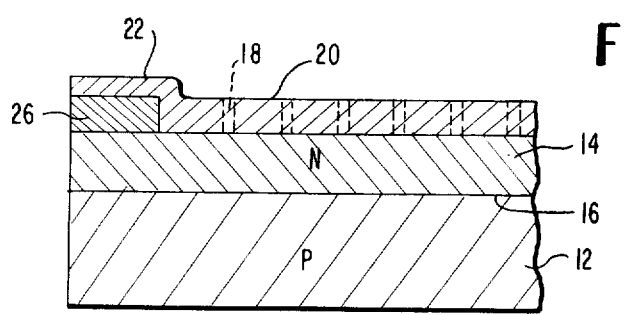
FIG. 3 is a cross-sectional view of FIG. 1 taken along line 3—3 of FIG. 1.

Referring to FIGS. 1, 2 and 3, the particular solar cell illustrated, except for the addition of the pad, is the same as the fine line geometry solar cell described in the above-mentioned patent application to Lindmayer. However, it should be understood that the present invention is equally applicable to other types of solar cells. Additionally, in the embodiment of FIGS. 1, 2 and 3 the pad is assumed to be formed of the same material as the anti-reflective coating, but in the broad aspect of the present invention that assumption is not necessary.

The solar cell comprises semiconductor 10, having a p-type portion 12 and an n-type portion 14 defining a p-n junction 16. A unitary metal top electrode having thin finger portions 18, larger fingers 20 and lands 22 is deposited on the top surface of the semiconductor 10. In a preferred embodiment the semiconductor is silicon and the electrode is formed by deposition of gold and chromium. An anti-reflective coating 24, such as non-crystalline $Ta_2O_5$ or $Nb_2O_5$, covers all portions of the silicon surface not covered by the top electrode.

A pad of material, 26, appears underneath the land portions 22 of the electrode. The pad is a relatively hard material having poor thermal conductivity and in one specific embodiment is the same as the anti-reflective coating. For example, the pad may be non-crystalline $Ta_2O_5$ or $Nb_2O_5$ with the tantalum pentoxide being preferred. Other materials suitable for both the pad and the anti-reflective coating are $TiO_2$.

In the particular drawing shown the pad is under only the central portion of the lands 22 and the land edges overlap and touch the silicon surface. This particular feature is irrelevant. The important point is that the pad 26 is beneath the land 22; the land being defined herein as the portion of the top electrode to which the interconnector will be bonded.

A quartz cover slide 28 prevents harmful radiation from reaching the cell, and a bottom electrode, not shown, is provided on the bottom surface of layer 12 of semiconductor 10. The anti-reflective coating need not be confined to only surface areas not covered by the electrode but may cover the electrode as well. Additionally, as will be shown below, the electrode may further include a layer of elemental metal, the oxide of which forms the anti-reflective coating and the pad, beneath all portions thereof except the lands.

Figure 4A:
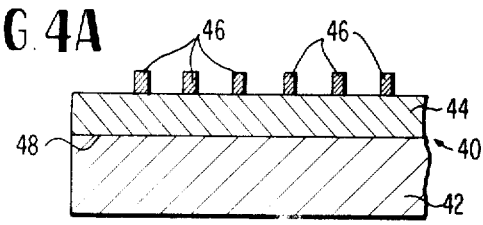
FIGS. 4A – 4F are side views of a solar cell at various stages of completion of a first process for fabricating the solar cell.

FIGS. 4A through 4F illustrate various stages of the cell during fabrication in accordance with a preferred method. Referring first to FIG. 4A, a semiconductor material 40, preferably silicon, has a p-n junction 48 formed therein. The junction may be formed conventional techniques. One particular preferred technique for forming the p-n junction is described in the U.S. patent application entitled, "Method for the Diffusion of Impurities Into a Semiconductor," by Lindmayer, Ser. No. 331,740, filed Feb. 13, 1973, and assigned to the assignee herein.

A pattern of photoresist 46 is fabricated on the silicon surface. The pattern is identical to the electrode pattern, e.g., electrode shown in FIG. 1, with one important exception. The photoresist pattern does not include photoresist at positions corresponding to the land portions of the electrode. The desired pattern may be created using standard photolithographic techniques common to the semiconductor arts. Reference is made to copending patent applications I, II and III above for specific photolithography techniques. One difference in the present case from the above-mentioned applications is the pattern of the mask through which the photoresist is exposed. For positive exposure photolithography, the opaque pattern of the mask is as described above, i.e., identical to the electrode pattern with the one mentioned exception.

Figure 4B:
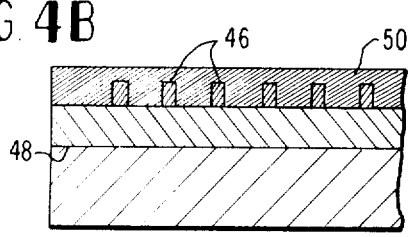

Next, as shown in FIG. 4B, a layer of elemental metal 50 is vacuum deposited onto the cell surface. The metal may be any metal suitable in forming the anti-reflective coating and the pad. Preferred examples are Ta, Nb and Ti. The elemental metal layer may be deposited by electron beam evaporation techniques. A thickness of about 200A. for example, will be suitable.

Using standard photolithographic lift-off techniques, the remaining photoresist 46 and the metal overlaying the photoresist is removed. The metal layer remaining after lift-off has a pattern which is a negative of the photoresist pattern in FIG. 4A.

Next the metal is oxidized to form, for example, $Ta_2O_5$, $Nb_2O_5$ or $TiO_2$. This may be accomplished by thermal oxidation or by anodic oxidation. Each of these types of oxidation is well known. Also each type is described in pending application I identified above. In the case of tantalum and niobium the resulting layer will be mostly non-crystalline as opposed to crystalline. The oxidized metal layer is shown at 52 in FIG. 4C.

Figure 4D:
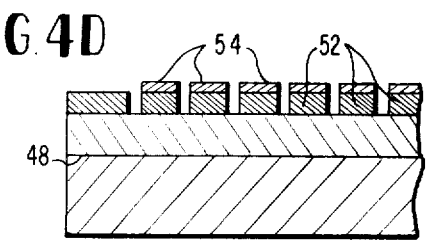

The oxide pattern is covered with another photoresist which is exposed to ultraviolet light through another mask. The mask is a negative of the metal electrode pattern. That is, the transparent portion of the mask has the same pattern as the metal electrode. The exposed photoresist is developed and removed, according to known techniques, leaving a photoresist pattern 54, as shown in FIG. 4D. The photoresist covers all of the oxide except that part of the oxide which will underlie the land portion of the electrode.

Figure 4E:
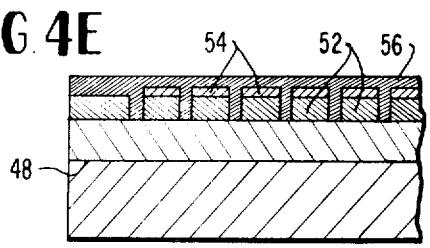

A layer of metal, e.g., gold and chromium, is deposited as shown at 56 in FIG. 4E. The method of depositing the metal layer may be carried out by any conventional process. Details of the deposition of this layer are found in copending applications I, II and III, identified above.

Figure 4F:
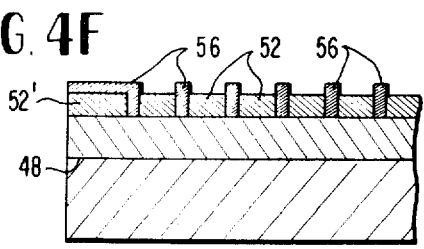

By using standard photolithographic lift-off techniques, the remaining photoresist 54 and the metal layer portions above the photoresist 54 are removed, leaving the cell structure shown in FIG. 4F. This structure includes an electrode 56 of the desired pattern, an anti-reflective coating 52, e.g., $Ta_2O_5$, $Nb_2O_5$ or $TiO_2$, covering all surfaces not covered by the electrode, and a pad 52' of the same composition as the anti-reflective coating underneath the land portion of the electrode.

An alternate method is illustrated in FIGS. 5A – 5F. In this method the pad is fabricated separately from the anti-reflective coating. Consequently, the pad need not be formed of the same material as the anti-reflective coating, but it may consist of the same material. This particular method, with the addition of the pad forming step, corresponds to the preferred method described in copending application III identified above. The specific process steps may be individually carried out identically to those in the process described above. The difference lies in the order of steps and the masking used.

Figure 5A:
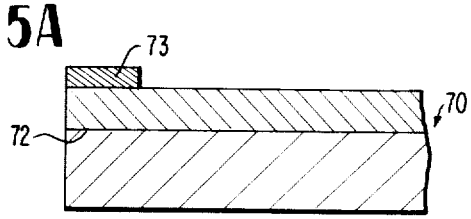
FIGS. 5A – 5F are side views of a solar cell at various stages of completion of a second process for fabricating the solar cell.
Figure 5B:
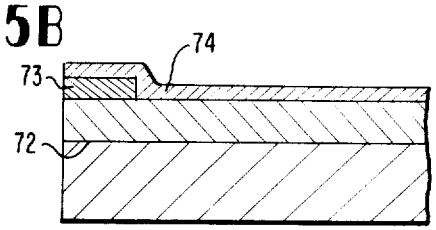
Figure 4C:
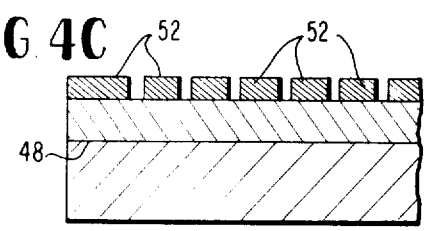
Figure 5C:
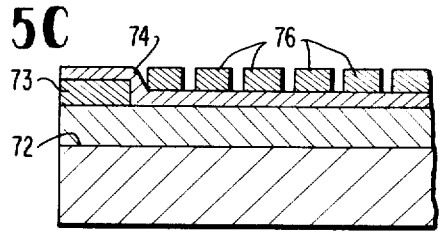

Referring to FIG. 5A, the semiconductor 20 has a p-n junction formed therein. This is followed by separate formation of the pad. For example, if the pad is to consist of amorphous $Ta_2O_5$, a layer of Ta is deposited by electron deposition through a photoresist layer which has been exposed, developed and removed in the pad region. The remaining photoresist and overlaying tantalum is removed, and the remaining tantalum is oxidized to $Ta_2O_5$ by thermal or anodic oxidation. This results in the pad 73 being formed at the position of the electrode land portions. Next a complete layer of metal 74 is deposited onto the device as shown in FIG. 5B. The metal selected is the one which will be oxidized to form the anti-reflective coating. As an example The metal may be Ta, Nb, or Ti. the metal layer 74 is then covered with a photoresist which is exposed through a mask having a transparent pattern identical to the desired electrode pattern. The exposed photoresist is removed, leaving a photoresist pattern 76, which is the exact negative of the desired electrode pattern. This is illustrated in FIG. 5C.

Figure 5D:
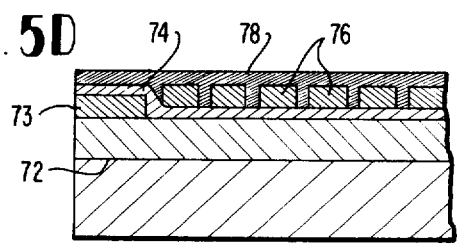
Figure 5E:
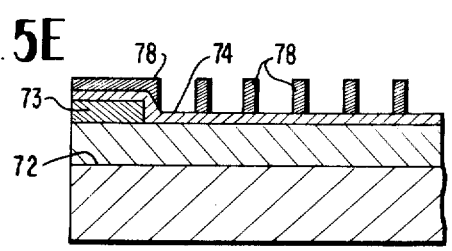

A layer of metal 78, which forms the electrode, is deposited onto the device as shown in FIG. 5D. This metal is preferably gold and chromium. The remaining photoresist 76 and the portions of metal layer 78 which overlay the photoresist are removed by photolithographic lift-off techniques. The resulting device is shown in FIG. 5E. There, the gold-chromium electrode is in the desired pattern shape for the electrode, but it lies on a layer of conductive metal, e.g., Ta.

Figure 5F:
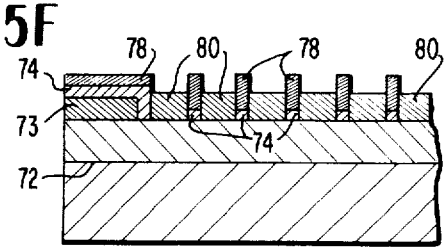

In the next step the device is subjected to thermal or anodic oxidation. The metal 73, e.g., Ta, Nb, or Ti, will oxidize where it is not covered by electrode pattern 78. However, the metal 78 will not oxidize. The elemental metal 74 remaining after oxidation is directly beneath the gold-chromium pattern 78 and becomes a part of the electrode. The metal 74 which has been oxidized to $Ta_2O_5$, $Nb_2O_5$ or $TiO_2$ becomes the device anti-reflective coating 80 as shown in FIG. 5F.

What is claimed is:

1. A solar cell comprising a semiconductor material having a p-n junction therein, an electrode covering a portion of the top surface of said cell and including a land portion for attachment to an interconnector, a pad of thermally insulating material on said surface beneath said land portion of said electrode, and an anti-reflective coating covering at least those portions of said cell top surface not covered by said electrode, said pad and anti-reflective coating consisting of the identical material.

2. A solar cell as claimed in claim 1 wherein said same material is mostly non-crystalline $Ta_2O_5$.

3. A solar cell as claimed in claim 1 wherein said same material is mostly non-crystalline $Nb_2O_5$.

4. A solar cell as claimed in claim 1 wherein said same material is mostly $TiO_2$.

5. A method of making a solar cell comprising,
   a. forming a p-n junction in a semiconductor layer substantially parallel to a top surface of said semiconductor layer,
   b. forming a layer of anti-reflective material on said top surface, said layer having a pattern exposing regions of said top surface, and
   c. depositing a top electrode onto said exposed regions and onto at least a top surface portion of said layer of anti-reflective material, the part of said electrode deposited onto said top surface portion of said layer of anti-reflective material being the land portion of said electrode, whereby said top surface portion thermally insulates said land portion from the semiconductor surface directly thereunder.

6. The method as claimed in claim 5 wherein said layer of anti-reflective material is mostly non-crystalline tantalum pentoxide.

7. The method as claimed in claim 5 wherein said layer of anti-reflective material is mostly non-crystalline niobium pentoxide.

8. The method as claimed in claim 5 wherein said layer of anti-reflective material is titanium oxide.

9. The method as claimed in claim 5 wherein the step of forming a layer of anti-reflective material comprises,
   a. forming a pattern of photoresist on said top surface, said pattern being identical to the pattern of the later formed top electrode except that said photoresist pattern does not include photoresist at positions corresponding to the land portions of said top electrode,
   b. depositing a layer of metal on said top surface and said photoresist pattern, said metal being the metal constituent of the anti-reflective material,
   c. removing said photoresist pattern and said metal directly overlaying said photoresist,
   d. oxidizing said metal to a metal oxide.

10. The method as claimed in claim 9 wherein said metal is tantalum and the step of oxidizing is carried out by anodically oxidizing said tantalum.

11. The method as claimed in claim 10 wherein said metal is tantalum and the step of oxidizing is carried out by thermally oxidizing said tantalum.

12. The method as claimed in claim 9 wherein said metal is niobium and the step of oxidizing is carried out by anodically oxidizing said niobium.

13. The method as claimed in claim 9 wherein said metal is niobium and the step of oxidizing is carried out by thermally oxidizing said niobium.

14. The method as claimed in claim 9 wherein the step of depositing a top electrode comprises,
   a. forming a photoresist coating on said entire pattern of anti-reflective material except for those portions of said anti-reflective material which will underlie said land portions of said electrode,
   b. depositing metal to form an electrode on said last mentioned photoresist, said exposed top surface, and said portions of said anti-reflective coating, and
   c. removing said last mentioned photoresist and the deposited metal overlaying said photoresist.

15. A method of forming a solar cell comprising,
   a. forming a p-n junction, in a semiconductor layer, substantially parallel to the top surface of said layer,
   b. forming a layer of thermally insulating material on a portion of said top surface, said portion corresponding to the land portion of a top electrode to be placed on said solar cell,
   c. depositing a layer of metal on said thermally insulating material and the exposed portion of said top surface, said metal being the metal constituent of an anti-reflective coating,
   d. depositing a metal electrode onto said last mentioned layer of metal, said metal electrode forming a predetermined pattern including land portions directly above said thermally insulating material, and
   e. oxidizing the portions of said last mentioned layer of metal not covered by said metal electrode pattern to form an anti-reflective coating.

16. The method as claimed in claim 15 wherein the step of forming a layer of thermally insulating material on a portion of said top surface comprises,
   a. depositing a metal selected from the group consisting of tantalum, niobium, and titanium onto said portion of said top surface, and
   b. oxidizing said last mentioned metal to a metal oxide.

17. The method as claimed in claim 16 wherein said metal is tantalum and said metal oxide is mostly non-crystalline tantalum pentoxide.

18. The method as claimed in claim 16 wherein said metal is niobium and said metal oxide is mostly non-crystalline niobium pentoxide.

19. The method as claimed in claim 16 wherein said metal is titanium and said metal oxide is titanium oxide.

* * * * *